(12) United States Patent
An et al.

(10) Patent No.: US 12,513,920 B2
(45) Date of Patent: Dec. 30, 2025

(54) SEMICONDUCTOR DEVICE AND METHOD FOR FABRICATING THE SAME

(71) Applicant: SK hynix Inc., Gyeonggi-do (KR)

(72) Inventors: Ji Hoon An, Gyeonggi-do (KR); Byung Sang Kim, Gyeonggi-do (KR); Seung Bum Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 775 days.

(21) Appl. No.: 17/846,644

(22) Filed: Jun. 22, 2022

(65) Prior Publication Data

US 2023/0111881 A1   Apr. 13, 2023

(30) Foreign Application Priority Data

Oct. 13, 2021 (KR) .................. 10-2021-0135776

(51) Int. Cl.
*H10D 1/68* (2025.01)
*H10B 12/00* (2023.01)
*H10D 1/00* (2025.01)

(52) U.S. Cl.
CPC ............ *H10D 1/696* (2025.01); *H10B 12/03* (2023.02); *H10D 1/042* (2025.01); *H10D 1/711* (2025.01); *H10D 1/716* (2025.01)

(58) Field of Classification Search
CPC ......... H10B 12/03–0387; H10D 1/696; H10D 1/711; H01L 28/75
See application file for complete search history.

(56) References Cited

U.S. PATENT DOCUMENTS

| | | |
|---|---|---|
| 2012/0181660 A1 | 7/2012 | Fujiwara |
| 2018/0019300 A1* | 1/2018 | Lee ..................... H10D 1/716 |
| 2019/0267383 A1 | 8/2019 | Rocklein et al. |

FOREIGN PATENT DOCUMENTS

| | | | |
|---|---|---|---|
| JP | 2000-340769 A | 12/2000 | |
| JP | 2015-231025 A | 12/2015 | |
| KR | 10-2001-0064097 A | 7/2001 | |
| KR | 10-2003-0002035 A | 1/2003 | |
| KR | 10-2003-0003353 A | 1/2003 | |
| KR | 10-2008-0002033 A | 1/2018 | |
| KR | 10-2020-0019553 A | 2/2020 | |
| WO | WO-2009090979 A1 * | 7/2009 | ....... H01L 27/10852 |

OTHER PUBLICATIONS

WO-2009090979—Machine English Translation (Year: 2025).*
Office Action for Korean Patent Application No. 10-2021-0135776 issued by the Korean Intellectual Property Office (KIPO) on Apr. 11, 2025.

* cited by examiner

*Primary Examiner* — Jose R Diaz
(74) *Attorney, Agent, or Firm* — IP & T GROUP LLP

(57) ABSTRACT

Embodiments of the present invention may provide a semiconductor device capable of covering the entire surface of a dielectric layer by increasing continuity while maintaining a thickness of an upper electrode of a capacitor, and a method of manufacturing the same. In addition, embodiments of the present invention may provide a semiconductor device capable of alleviating bending of a lower electrode and a method of manufacturing the same. According to the present invention, a semiconductor device comprises a lower electrode structure formed over a substrate; a dielectric layer formed over the lower electrode structure; and an upper electrode structure formed on the dielectric layer and including a silicon-containing amorphous layer in contact with the dielectric layer.

43 Claims, 16 Drawing Sheets

SEMICONDUCTOR DEVICE AND METHOD FOR FABRICATING THE SAME

CROSS-REFERENCE TO RELATED APPLICATIONS

The present application claims priority to Korean Patent Application No, 10-2021-0135776, filed on Oct. 13, 2021, which is incorporated herein by reference in its entirety.

BACKGROUND

1. Field

The present invention relates to a semiconductor device and a method for fabricating the same, and more particularly, to a capacitor of the semiconductor device and a method for fabricating the capacitor.

2. Description of the Related Art

As semiconductor devices are integrated, securing continuity has become difficult due to the occurrence of bending of a lower electrode and reduction in the thickness of upper electrodes. Accordingly, the characteristics of the capacitor may be deteriorated.

SUMMARY

Embodiments of the present invention may provide a semiconductor device capable of covering the entire surface of a dielectric layer by increasing continuity while maintaining a thickness of an upper electrode of a capacitor, and a method of fabricating the same.

Also, embodiments of the present invention may provide a semiconductor device capable of alleviating the occurrence of bending of a lower electrode and a method of fabricating the same.

A semiconductor device according to an embodiment of the present invention comprises: a lower electrode structure formed over a substrate; a dielectric layer formed over the lower electrode structure; and an upper electrode structure formed on the dielectric layer and including a silicon-containing amorphous layer in contact with the dielectric layer.

A semiconductor device according to an embodiment of the present invention comprises: a lower electrode structure including a stack structure of a first lower electrode formed over a substrate and having a cylinder structure and a second lower electrode disposed inside the first lower electrode and having a smaller grain size than the first lower electrode; a dielectric layer formed over the lower electrode structure; and an upper electrode structure formed over the dielectric layer.

A method for fabricating a semiconductor device according to an embodiment of the present invention comprises: forming a lower electrode structure over a substrate; forming a dielectric layer over the lower electrode structure; and forming an upper electrode structure including a silicon-containing amorphous layer over the dielectric layer.

A method for fabricating a semiconductor device according to an embodiment of the present invention comprises: forming a lower electrode structure including a stack structure of a first lower electrode having a cylinder structure and formed over a substrate and a second lower electrode, the second lower electrode being disposed inside the first lower electrode and having a smaller grain size than the first lower electrode; forming a dielectric layer over the lower electrode structure; and forming an upper electrode structure over the dielectric layer.

The present invention has the effect of improving the reliability of a semiconductor device by applying an upper electrode of a capacitor as a stacked structure of an amorphous layer and a crystalline layer to cover all the surface of the dielectric layer even with a thin thickness.

In addition, the present invention has an effect of improving the reliability of the semiconductor device by alleviating the occurrence of bending of the lower electrode.

DETAILED DESCRIPTION

Figure 1:
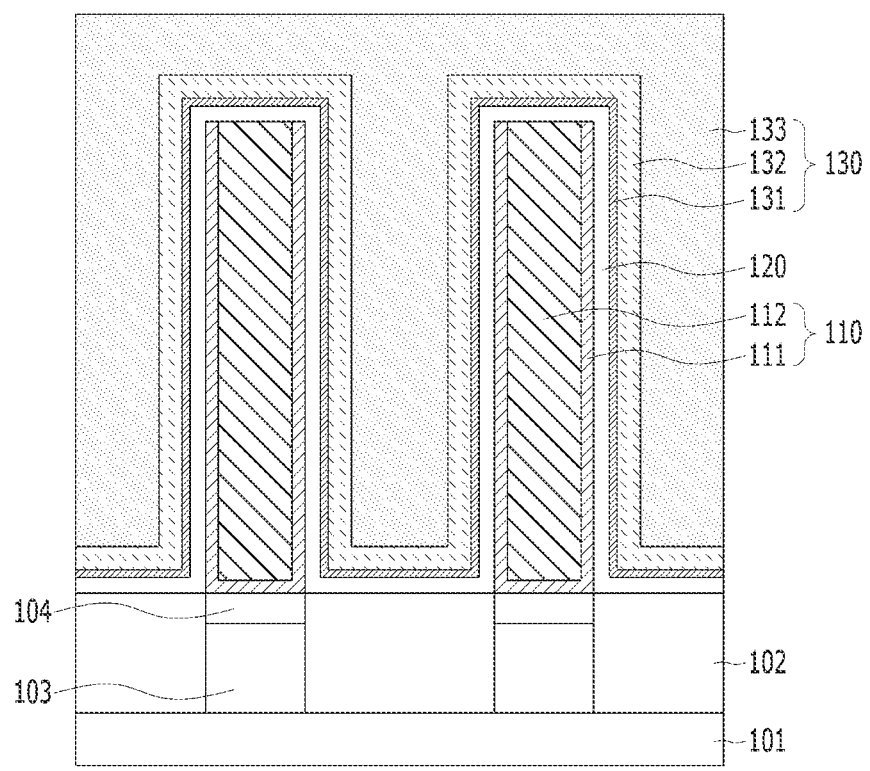
FIGS. 1 to 6 are cross-sectional views illustrating capacitors according to embodiments of the present invention.

Various embodiments described herein will be described with reference to cross-sectional views, plan views and block diagrams, which are schematic views of the present invention. Therefore, the structures of the drawings may be modified by fabricating technology and/or tolerances. Various embodiments of the present invention are not limited to the specific structures shown in the drawings, but include any changes in the structures that may be produced according to the fabricating process. Also, any regions and shapes of regions illustrated in the drawings have schematic views, are intended to illustrate specific examples of structures of regions of the various elements, and are not intended to limit the scope of the invention.

Figure 8:
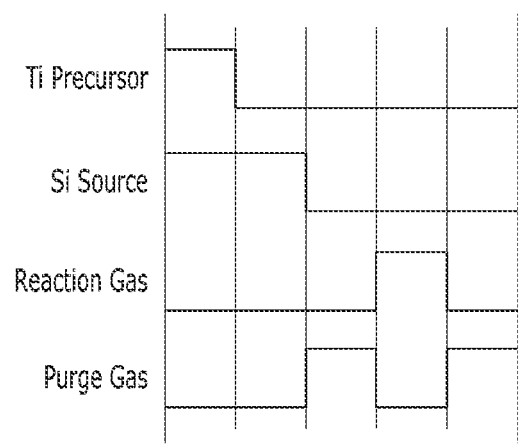
FIG. 8 is a timing diagram for forming titanium silicon nitride of a lower electrode according to an embodiment of the present invention.
Figure 9:
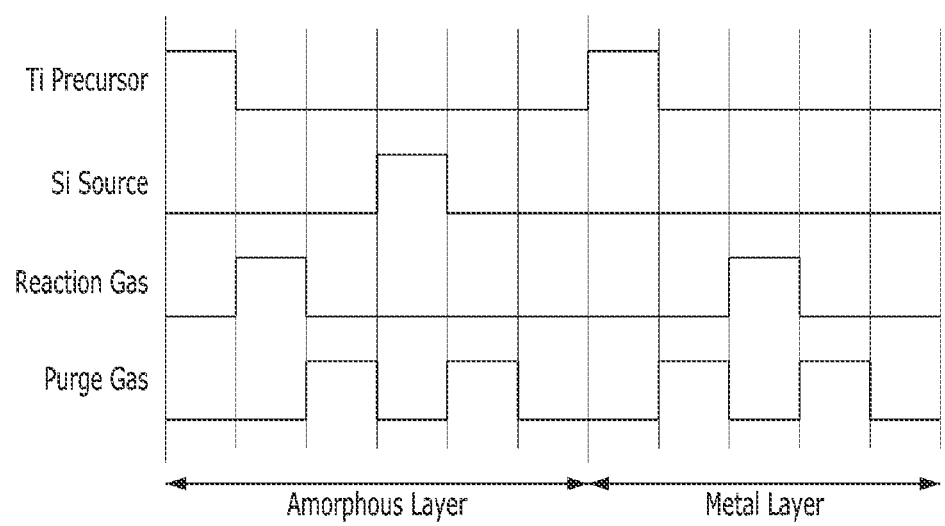
FIG. 9 is a timing diagram for forming an upper electrode according to an embodiment of the present invention.

FIGS. 1 to 6 are diagrams illustrating capacitors according to embodiments of the present invention. FIG. 8 is a timing diagram for forming the titanium silicon nitride of a lower electrode according to an embodiment of the present invention, FIG. 9 is a timing diagram for forming an upper electrode according to an embodiment of the present invention.

As shown in FIG. 1, a semiconductor device includes a substrate 101, an interlayer insulating layer 102 formed on the substrate 101, and storage node contact structures 103 and 104 connected to the substrate 101 through the interlayer insulating layer 102, The semiconductor device further includes a capacitor structure formed on the interlayer insulating layer 102. The capacitor structure includes a lower electrode structure 110 connected to the storage node contact structures 103 and 104, a dielectric layer 120 covering the entire structure including the lower electrode structure 110, and an upper electrode structure 130 formed on the dielectric layer 120.

The substrate 101 may be a material suitable for semiconductor processing. The substrate 101 may include a semiconductor substrate. The substrate 101 may be made of a material containing silicon. The substrate 101 may include silicon, monocrystalline silicon, polysilicon, amorphous silicon, silicon germanium, monocrystalline silicon germanium, polycrystalline silicon germanium, carbon doped silicon, combinations thereof, or multiple layers thereof. The substrate 101 may include other semiconductor materials such as germanium. The substrate 101 may include a III/V group semiconductor substrate, for example, a compound semiconductor substrate such as GaAs. The substrate 101 may include a silicon on insulator (SOT) substrate.

Although not shown, a buried gate structure may be disposed in the substrate 101, and a bit line structure may be disposed between the storage node contact structures 103 and 104 on the substrate 101.

The interlayer insulating layer 102 may include a single-layer or multi-layered dielectric material. The interlayer insulating layer 102 may include a multi-layered dielectric material with the multiple layers having the same etch selectivity. The interlayer insulating layer 102 may include a multi-layered dielectric material with the multiple layers having a different etch selectivity. For example, the interlayer insulating layer 102 may include nitride, oxide, oxynitride, or a combination thereof.

The storage node contact structures 103 and 104 may pass through the interlayer insulating layer 102 to be connected to the substrate 101. One end of the storage node contact structures 103 and 104 may directly contact a bonding region (not shown) of the substrate 101. Another end of the storage node contact structures 103 and 104 may directly contact the lower electrode structure 110. The storage node contact structures 103 and 104 may electrically connect the substrate 101 and the lower electrode structure 110. The storage node contact structures 103 and 104 may be a stack of a lower plug 103 and an upper plug 104. The lower plug 103 may include a silicon plug. The upper plug 104 may include a metal plug.

The lower electrode structure 110 may include a first lower electrode 111 having a cylinder structure and a second lower electrode 112 disposed inside the first lower electrode 111 and having a pillar structure. The first lower electrode 111 may have a U-shape in a cross-sectional view. The first lower electrode 111 may have a ring shape in a plan view. The second lower electrode 112 may have an I-shape in a cross-sectional view. The second lower electrode 112 may have a circle shape in a plan view. The lower electrode structure 110 may have a shape in which the first lower electrode 111 covers a sidewall and a bottom surface of the second lower electrode 112 in a cross-sectional view. The lower electrode structure 110 may have a shape in which the first lower electrode 111 surrounds the circumference of the second lower electrode 112 in a plan view.

The lower electrode structure 110 may have a high aspect ratio. The lower electrode structure 110 may have an aspect ratio of at least 1:1 or more. For example, the lower electrode structure 110 may have a high aspect ratio of 1:10 or more. The aspect ration refers to a ratio of width to height. The upper surface of the first lower electrode 111 and the upper surface of the second lower electrode 112 may be at the same level. In another embodiment, the upper surface of the second lower electrode 112 may be positioned at a lower level than the upper surface of the first lower electrode 111.

A grain size of the second lower electrode 112 may be smaller than a grain size of the first lower electrode 111. Hardness of the second lower electrode 112 may be greater than that of the first lower electrode 111. The second lower electrode 112 may include a material that is more suitable for gap-filling than the first lower electrode 111. The resistivity of the first lower electrode 111 may be lower than the resistivity of the second lower electrode 112.

The first lower electrode 111 may include metal nitride. For example, the metal nitride may include titanium nitride. In another embodiment, the metal nitride may include a low resistivity metal nitride. For example, the metal nitride having a low resistivity may include any one of tantalum nitride (TaN), niobium nitride (NbN), molybdenum nitride (MoN), and tungsten nitride (WN), but is not limited thereto. The second lower electrode 112 may include a metal nitride containing silicon. For example, the second lower electrode 112 may include titanium silicon nitride.

The second lower electrode 112 may be formed by an atomic layer deposition process. The second lower electrode 112 according to an embodiment of the present invention may include titanium silicon nitride. Therefore, the atomic layer deposition process for forming the second lower electrode 112 may be performed as a process for forming titanium silicon nitride. The atomic layer deposition process for forming the second lower electrode 112 may be referenced by the timing diagram of FIG. 8.

Referring to FIG. 8, a unit cycle for forming titanium silicon nitride may proceed in the order of a step of supplying a Ti precursor and Si source, a step of supplying a Si source, a step of supplying a purge gas, a step of supplying a reaction gas and a purge gas. That is, in the unit cycle for forming the titanium silicon nitride according to an embodiment of the present invention, after the step of supplying the Si source is performed twice, the steps of supplying the purge gas and the reaction gas may be sequentially performed.

The step of supplying the Ti precursor and the Si source may refer to a step of forming a metal precursor layer, a silicon layer, and a metal silicon layer. The step of supplying the Ti precursor and the Si source may include supplying a metal-containing precursor and a Si source gas on a deposition target layer (in this embodiment, the deposition target layer refers to the mold structure M10 including the opening 16 shown in FIG. 76) in a reaction region. For example, the Ti precursor may include titanium tetrachloride ($TiCl_4$), but is not limited thereto, and may include a metal precursor including titanium. The Si source gas may include, for example, silane tetrahydride ($SiH_4$), but is not limited thereto. The Si source may include any source gas including silicon.

The step of supplying the Si source may refer to a step of forming titanium silicon nitride by supplying a Si source gas onto the mold structure including the opening. The Si source gas may include, for example, $SiH_4$, but is not limited thereto. The Si source may include any source gas including silicon. In an embodiment of the present invention, the content of silicon in the film may be controlled through the step of supplying the Si source, That is, by controlling the content of silicon in the film, the grain size and hardness of the film can be adjusted.

The step of supplying a purge gas may refer to a step of supplying a purge gas on the mold structure including the opening to remove unnecessary by-products in the reaction region. The purge gas may include, for example, nitrogen gas ($N_2$).

The step of supplying the reaction gas may refer to the step of forming titanium silicon nitride by supplying the reaction gas onto the mold structure including the opening. The reaction gas may include, for example, ammonia ($NH_3$), but is not limited thereto, and may include a reaction gas including nitride.

As the content of silicon in the film of the second lower electrode 112 increases, the grain size decreases and the hardness of the film increases. In other words, when an external stress is applied, the dislocation moves along the slip plane of the grain, and at the grain boundary where the orientation of the grain changes, the dislocation movement becomes difficult, Therefore, the hardness of the film may increase because there are relatively more grain boundaries as the grain size decreases.

As a result, bending of the lower electrode structure 110 during the dip-out process can be prevented as the overall hardness of the lower electrode structure 110 increases.

The dielectric layer 120 may cover the entire structure including the lower electrode structure 110, The dielectric layer 120 may be formed to directly contact the first lower electrode 111 which as noted earlier has a lower resistivity than the second lower electrode 112.

The dielectric layer 120 may include a single-layered structure, a multi-layered structure, or a laminated structure. The dielectric layer 120 may have a doping structure or an intermixing structure. The dielectric layer 120 may include a high-k material. The dielectric layer 120 may have a higher dielectric constant than that of silicon oxide ($SiO_2$). Silicon oxide may have a dielectric constant of about 3.9, and the dielectric layer 120 may include a material having a dielectric constant of 4 or more. The high-k material may have a dielectric constant of about 20 or more. The high-k material may include hafnium oxide ($HFO_2$), zirconium oxide ($ZrO_2$), aluminum oxide ($Al_2O_3$), titanium oxide ($TiO_2$), tantalum oxide ($Ta_2O_5$), niobium oxide ($Nb_2O_5$), or strontium titanium oxide ($SrTiO_3$), In another embodiment, the dielectric layer 120 may be formed of a composite layer including two or more layers of the aforementioned high-k materials. The dielectric layer 120 may be formed of zirconium-based oxide. The dielectric layer 120 may have a stack structure including zirconium oxide ($ZrO_2$). The stack structure including zirconium oxide ($ZrO_2$) may include ZA ($ZrO_2/Al_2O_3$) or ZAZ ($ZrO_2/Al_2O_3/ZrO_2$). ZA may have a structure in which aluminum oxide is stacked on zirconium oxide. ZAZ may have a structure in which zirconium oxide, aluminum oxide, and zirconium oxide are sequentially stacked, $ZrO_2$, ZA and ZAZ may be referred to as a zirconium oxide ($ZrO_2$)-based layer. In another embodiment, the dielectric layer 120 may be formed of hafnium (Hf)-based oxide. The dielectric layer 120 may have a stack structure including hafnium oxide ($HfO_2$). The stack structure including hafnium oxide ($HfO_2$) may include HA ($HfO_2/Al_2O_3$) or HAH ($HfO_2/Al_2O_3/HfO_2$). HA may have a structure in which aluminum oxide is laminated on hafnium oxide. The HAH may have a structure in which hafnium oxide, aluminum oxide, and hafnium oxide are sequentially stacked. $HfO_2$, HA and HAH may be referred to as a hafnium oxide ($HfO_2$)-based layer.

In ZA, ZAZ, HA, and HAH, aluminum oxide ($Al_2O_3$) may have a larger band gap than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer 120 may include a stack of a high-k material and a high-bandgap material having a bandgap larger than that of the high-k material. The dielectric layer 120 may include silicon oxide ($SiO_2$) as a high bandgap material other than aluminum oxide. Since the dielectric layer 120 includes a high bandgap material, leakage current may be suppressed. High bandgap materials may be extremely thin. The high bandgap material may be thinner than the high-k material.

In another embodiment, the dielectric layer 120 may include a laminate structure in which a high-k material and a high-bandgap material are alternately stacked. For example, the dielectric layer 120 may include ZAZA ($ZrO_2/Al_2O_3/ZrO_2/Al_2O_3$), ZAZAZ ($ZrO_2/Al_2O_3/ZrO_2/Al_2O_3/ZrO_2$), HAHA ($HfO_2/Al_2O_3/HfO_2/Al_2O_3$) or HAHAH ($HfO_2/Al_2O_3/HfO_2/Al_2O_3/HfO_2$). In the above laminate structure, aluminum oxide ($Al_2O_3$) may be extremely thin.

The upper electrode structure 130 may cover the entire surface of the dielectric layer 120. The upper electrode structure 130 may be free of non-contact portions between the dielectric layer 120 and the upper electrode structure 130 and increase the effective area of the capacitor structure by having continuity and covering the entire surface of the dielectric layer 120.

The upper electrode structure 130 may include an amorphous first upper electrode 131 in direct contact with the dielectric layer 120 and a crystalline second upper electrode 132 formed on the first upper electrode 131. The first and second upper electrodes 131 and 132 may cover the entire surface of the dielectric layer 120, and may be formed to have a uniform thickness along the steps of the lower electrode structure 110 and the dielectric layer 120.

For example, the upper electrode structure 130 may include a stack structure of an amorphous first upper electrode 131 having continuity and a crystalline second upper electrode 132 having discontinuity. In another embodiment, the upper electrode structure 130 may include a stack structure of an amorphous first upper electrode 131 having discontinuity and a crystalline second upper electrode 132 having continuity. In another embodiment, the upper electrode structure 130 may include an amorphous first upper electrode 131 and a crystalline second upper electrode 132 both having continuity. In another embodiment, each of the first upper electrode 131 and the second upper electrode 132 may be formed to have discontinuity, but the entire surface of the dielectric layer 120 may be in direct contact with the first upper electrode 131 or the second upper electrode 132. As a result, the upper electrode structure 130 may be formed to have continuity. In particular, in the present embodiment, the roughness and continuity of the crystalline second upper electrode 132 may be improved by first forming the amorphous first upper electrode 131 on the dielectric layer 120.

The first upper electrode 131 may be formed to have a minimum thickness so as not to deteriorate the resistivity characteristic of an electrode. The total thickness of the upper electrode 130 including the first upper electrode 131 and the second upper electrode 132 may be adjusted not to exceed 30 Å. For example, when the total thickness of the upper electrode 130 is about 30 Å, the thickness of the first upper electrode 131 may be about 7 Å, but the present invention is not limited thereto.

The first upper electrode 131 may include a metal nitride including silicon. For example, the first upper electrode 131 may include amorphous titanium silicon nitride (TiSiN). The second upper electrode 132 may include a metal nitride. For example, the second upper electrode 132 may include titanium nitride (TiN).

The amorphous first upper electrode 131 and the crystalline second upper electrode 132 may be formed in-situ in the same chamber. The amorphous first upper electrode 131 and the crystalline second upper electrode 132 may be formed by an atomic layer deposition process. The atomic layer deposition process for forming the amorphous first upper electrode 131 and the crystalline second upper electrode 132 may refer to the timing diagram of FIG. 9.

The timing diagram of FIG. 9 applies a titanium precursor as a metal precursor, but the present invention is not limited thereto. In another embodiment, the metal precursor may apply any metal precursor applicable to the upper electrode.

The processes of forming the upper electrode 130 of the present invention may be divided into a process of forming the amorphous first upper electrode 131 and a process of forming the crystalline second upper electrode 132, respectively. In this embodiment, the timing diagram for forming the amorphous first upper electrode 131 and the timing diagram for forming the crystalline second upper electrode 132 are successively shown, but each timing diagram is to illustrate a unit cycle for forming each upper electrode. Accordingly, each upper electrode may be formed by repeating the unit cycle. That is, after repeating the unit cycle for forming the amorphous layer to form the amorphous first upper electrode 131, the unit cycle for forming the metal layer may then be repeated to form the crystalline second upper electrode 132.

A unit cycle of forming the amorphous first upper electrode 131 may proceed in the order of a step of supplying Ti precursor, a step of supplying a purge gas, a step of supplying a reaction gas, a step of supplying a purge gas, a step of supplying a Si source, and a step of supplying a purge gas.

The step of supplying the Ti precursor may refer to a step of supplying a precursor including a metal on the dielectric layer 120 in the reaction region to form a metal precursor layer. For example, the Ti precursor may include TiCl$_4$, but it is not limited thereto. The Ti precursor may include any metal precursor including titanium.

The step of supplying the purge gas may refer to a step of supplying a purge gas on the dielectric layer 120 to remove unnecessary byproducts on the dielectric layer 120. The purge gas may include, for example, nitrogen (N$_2$) gas.

The step of supplying the reaction gas may refer to a step of forming titanium nitride by supplying the reaction gas on the dielectric layer 120. The reaction gas may include, for example, NH$_3$, but is not limited thereto. The reaction gas may include any reaction gas including nitride.

The step of supplying the Si source may refer to a step of forming titanium silicon nitride by supplying a source gas on the dielectric layer 120. The source gas may include, for example, SiH$_4$, but is not limited thereto. The Si source may include any source gas including silicon. When a silicon source is supplied into the titanium nitride formed through the step of supplying a reaction gas, silicon is diffused into the previously formed titanium nitride to increase the silicon concentration in the film, promote amorphization, and increase the deposition rate. As the concentration of silicon in the film increases, crystallinity may deteriorate. In detail, since the adsorption of TiCl$_4$, molecules, which is a source of titanium, is higher on the Si—N surface than on the Ti—N surface, TiCl$_4$ supplied during the Ti precursor stage is adsorbed on the Si—N surface while the unit cycle is repeated. Accordingly, an amorphous TiSiN film which is thin and continuous may be formed as the surface diffusion of Ti—N is suppressed.

The step of supplying a purge gas to remove unnecessary byproducts may be performed between the steps of supplying a reaction gas and a source gas and after the step of supplying a Si source.

As described above, the atomic layer deposition process may include a unit cycle proceeding in the order of a step of supplying a precursor, a step of supplying a purge gas, a step of supplying a reaction gas, a step of supplying a purge gas, a step of supplying a source gas, and a step of supplying a purge gas. The unit cycle may be repeated multiple times until the first upper electrode 131 is formed to have a predetermined thickness. The first upper electrode 131 may be formed to have a minimum thickness so as not to deteriorate the resistivity characteristic of the electrode.

A unit cycle of forming the crystalline second upper electrode 132 may proceed in the order of a step of supplying Ti precursor, a step of supplying a purge gas, a step of supplying of a reaction gas, and a step of supplying a purge gas.

The step of supplying the Ti precursor may refer to a step of supplying a metal-containing precursor onto the first upper electrode 131 in the reaction space to form a metal precursor layer. For example, the Ti precursor may include TiCl$_4$, but it is not limited thereto. The Ti precursor may include any metal precursor including titanium.

The step of supplying a purge gas may be performed each time after the step of supplying the Ti precursor and the step of supplying the reaction gas. It may refer to a step of removing unnecessary by-products on the first upper electrode 131 by supplying a purge gas to the first upper electrode 131. The purge gas may include, for example, nitrogen (N$_2$) gas.

The step of supplying the reaction gas may refer to a step of forming titanium nitride by supplying the reaction gas onto the first upper electrode 131. The reaction gas may include, for example, NH$_3$, but is not limited thereto. The reaction gas may include any reaction gas including nitride.

As described above, the atomic layer deposition process proceeds with a unit cycle including a step of supplying a Ti precursor, a step of supplying a purge gas, a step of supplying a reaction gas, and a step of supplying a purge gas. The unit cycle may be repeated multiple times until the second upper electrode 132 is formed to have a predetermined thickness. The continuity of the second upper electrode 132 may be improved by the amorphous first upper electrode 131. The thickness of the second upper electrode 132 may be greater than the thickness of the first upper electrode 131.

In this embodiment, the continuity of the upper electrode may be improved by applying a stack structure of the amorphous first upper electrode 131 and the crystalline second upper electrode 132. By improving the continuity of the upper electrode, it is possible to increase the effective area of the capacitor. By increasing the effective area, the capacitance value can be increased, and the leakage current can be reduced.

As a comparative example, the case of directly forming crystalline titanium nitride (TiN) on the dielectric layer is as follows. Titanium nitride may be formed by an atomic layer deposition process. In the atomic layer deposition process, a unit cycle including a step of supplying a Ti precursor, a step of supplying a purge gas, a step of supplying a reaction gas, and a step of supplying a purge gas may be repeatedly performed. In the step of supplying the Ti precursor, crystalline nuclei spaced apart from each other may be formed on the dielectric layer. When the step of supplying a reaction gas is performed after the step of supplying a purge gas, the previously formed crystalline nuclei may grow in vertical and horizontal directions, and at the same time, the roughness increases. As the unit cycle for forming titanium nitride is repeated, adjacent grains merge to suppress the horizontal growth as crystalline nuclei grow, and at the same time roughness reduces. However, since the vertical growth continues in a state in which the horizontal growth is suppressed, a columnar structure is eventually formed, and the roughness of the entire film increases. In the crystalline nucleation and growth stage, small-sized grains (embryo) disappear, and only large grains (nucleus) can grow, so that it is difficult to secure continuity because empty spaces are formed between the large grains.

In order to secure continuity, it is important that the thin film is grown in an amorphous state without having crystallinity. During the is growth process of the thin film, a surface diffusion reaction is required for the molecules that have reached the substrate surface to move to a stable position (the lattice position of the crystal). By suppressing such surface diffusion, the thin film may be grown in an amorphous state. That is, if the initial nucleation is suppressed while the reaction occurs at the surface of the substrate where the reaction gas molecules reach, a continuous thin film may be formed at a relatively low thickness compared to the crystalline thin film.

Therefore, in this embodiment, an amorphous first upper electrode 131 may be formed by supplying a silicon source into the titanium nitride formed through the step of supplying a reaction gas. The supplied silicon diffuses into the titanium nitride, thereby increasing the silicon concentration in the film and promoting amorphization at the same time.

In addition, an upper electrode needs a thin thickness to prevent cracking of the supporter due to tensile stress, but it is difficult to form an upper electrode having a desired thickness due to insufficient buried space resulting from device integration and the step coverage.

Accordingly, in the present embodiment, the amorphous first upper electrode 131 is formed to have a continuity even at a low thickness to cover the entire surface of the dielectric layer 120, and the crystalline second upper electrode 132 is applied on the amorphous first upper electrode 131. Therefore, the capacitor characteristics such as capacitance and leakage current can be improved by increasing the effective area of the capacitor and reducing resistivity without increasing the thickness of the electrode.

A third upper electrode 133 may be formed on the second upper electrode 132 gap-filling the spaces between the adjacent lower electrode structures 110.

The third upper electrode 133 may include a silicon-containing material, a germanium-containing material, a metal-containing material, or a combination thereof. The third upper electrode 133 may include a metal, a metal nitride, a metal carbide, a conductive metal oxide, or a combination thereof. The third upper electrode 133 may include titanium (Ti), titanium nitride (TiN), tantalum nitride (TaN), titanium carbon nitride (TiCN), tantalum carbon nitride (TaCN), tungsten (W), tungsten nitride (WN), ruthenium (Ru), iridium (Ir), ruthenium oxide ($RuO_2$), iridium oxide ($IrO_2$), or a combination thereof. The third upper electrode 132 may include a silicon (Si) layer, a germanium (Ge) layer, a silicon germanium (SiGe) layer, or a combination thereof. The third upper electrode 133 may be formed by stacking a silicon germanium layer on a silicon layer (Si/SiGe), The third upper electrode 133 may be formed by stacking a silicon germanium layer on a germanium layer (Ge/SiGe). The third upper electrode 133 may include a stack of a silicon-containing material and a metal-containing material. The third upper electrode 133 may be formed by stacking a silicon germanium layer and tungsten nitride (SiGe/WN).

In this embodiment, the third upper electrode 133 may include a gap-fill material and a low-resistivity material. The gap-fill material may include silicon germanium (SiGe), and the low-resistivity material may include tungsten (W). The gap-fill material may fill a narrow gap between the lower electrode structures 110 without voids. The low resistivity material may lower the resistivity of the upper electrode structure 130.

Figure 2:
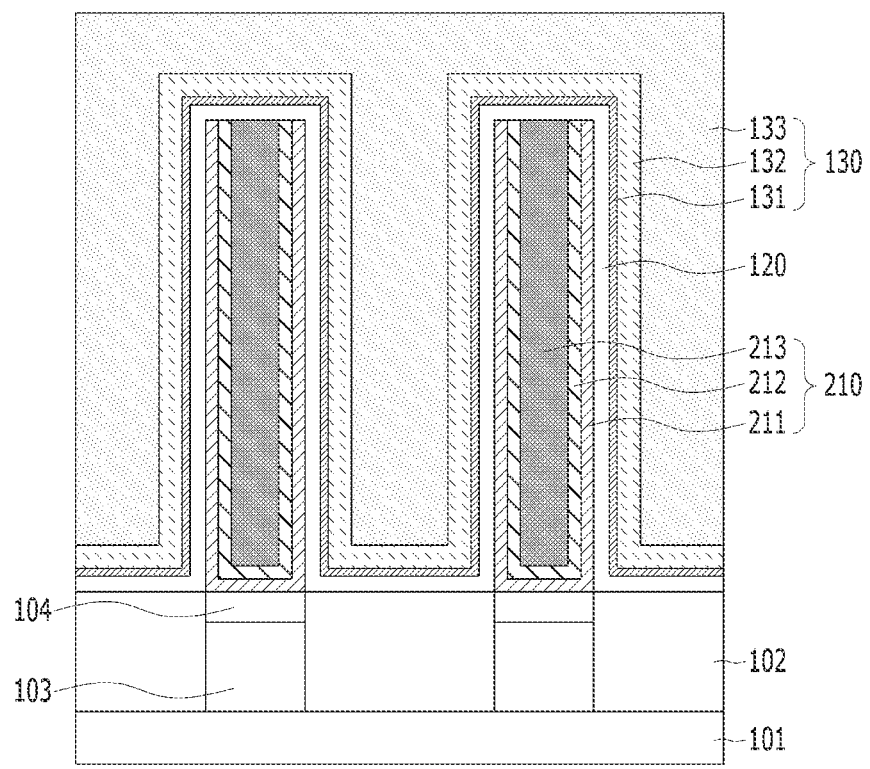

As shown in FIG. 2, the semiconductor device includes a substrate 101, an interlayer insulating layer 102 formed on the substrate 101, and storage node contact structures 103 and 104 connected to the substrate 101 through the interlayer insulating layer 102, The semiconductor device further includes a capacitor structure formed on the interlayer insulating layer 102, The capacitor structure includes a lower electrode structure 210 connected to the storage node contact structures 103 and 104, a dielectric layer 120 covering the entire structure including the lower electrode structure 210, and an upper electrode structure 130 formed on the dielectric layer 120.

The substrate 101, the interlayer insulating layer 102, the storage node contact structures 103 and 104, the dielectric layer 120, and the upper electrode structure 130 shown in FIG. 2 have the same structure as the substrate 101, the interlayer 102, the storage node contact structures 103 and 104, the dielectric layer 120, and the upper electrode structure 130 are also shown in FIG. 1. For convenience of description, a description of the duplicate structures will be omitted.

The lower electrode structure 210 may include a first lower electrode 211 including a cylinder structure a second lower electrode 212 including a cylinder structure and formed conformally along the inner surface of the first lower electrode 211, and a third lower electrode 112 disposed inside the second lower electrode 121 and having a pillar structure. The first lower electrode 211 and the second lower electrode 212 may have a U-shape in a cross-sectional view. The first lower electrode 211 and the second lower electrode 212 may have a ring shape in a plan view. The third lower electrode 213 may have an I-shape in a cross-sectional view. The third lower electrode 213 may have a circle shape in a plan view. In a cross-sectional view, the lower electrode structure 210 may have a shape where the first lower electrode 211 surrounds a sidewall and a bottom surface of the second lower electrode 212 and the second lower electrode 121 surrounds a sidewall and a bottom surface of the third lower electrode 213. In a plan view, the lower electrode structure 210 may have a shape where the first lower electrode 211 surrounds the circumference of the second lower electrode 212 and the second lower electrode 212 surrounds the circumference of the third lower electrode 213.

The lower electrode structure 210 may have a high aspect ratio. The lower electrode structure 210 may have an aspect ratio of at least 1:1 or more. For example, the lower electrode structure 210 may have a high aspect ratio of 1:10 or more. The aspect refers to a ratio of width to height. The upper surface of the first lower electrode 211, the upper surface of the second lower electrode 212, and the upper surface of the third lower electrode 213 may be at the same level. In another embodiment, the upper surface of the second lower electrode 212 may be positioned at a level lower than the upper surface of the first lower electrode 211. The third lower electrode 213 may gap-fill the step formed between the second lower electrode 212 and the first lower electrode 211. The upper surface of the third lower electrode 213 may be at the same level as the upper surface of the first lower electrode 211.

A grain size of the second lower electrode 212 may be smaller than a grain size of the first lower electrode 211. The hardness of the second lower electrode 212 may be greater than that of the first lower electrode 211. The second lower electrode 212 may include a material that is more suitable for gap-filling than the first lower electrode 211. The resistivity of the first lower electrode 211 may be lower than that of the second lower electrode 212.

The first lower electrode 211 may include a metal nitride. For example, the metal nitride may include titanium nitride. In another embodiment, the metal nitride may include a low resistivity metal nitride. The second lower electrode 212 may include a metal nitride containing silicon. For example, the second lower electrode 212 may include titanium silicon nitride. The third lower electrode 213 may include polysilicon.

The second lower electrode 212 may be formed by an atomic layer deposition process. The atomic layer deposition process for forming the second lower electrode 212 may refer to the timing diagram of FIG. 8, but is not limited thereto.

In particular, the second lower electrode 212 according to an embodiment of the present invention can control the content of silicon in the film in the deposition process. That is, the second lower electrode 212 may adjust the grain size and hardness of the film according to the content of silicon in the film.

As the content of silicon in the film of the second lower electrode 212 increases, the grain size decreases, and the hardness of the film increases. More specifically, when an external stress is applied, dislocation moves along the slip plane of the grain, and at the grain boundary where the orientation of the grain changes, the dislocation movement becomes difficult. Therefore, the hardness of the film may increase because there are relatively more grain boundaries as the grain size decreases.

As a result, bending of the lower electrode structure 210 during the dip-out process may be prevented as the overall hardness of the lower electrode structure 210 increases.

Figure 3:
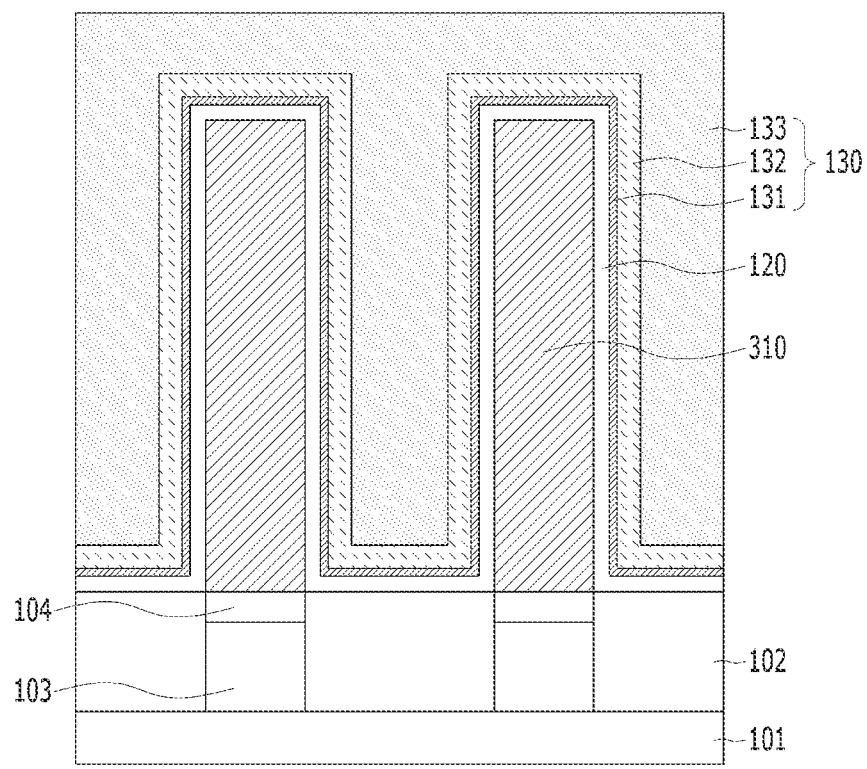

As shown in FIG. 3, the semiconductor device includes a substrate 101, an interlayer insulating layer 102 formed on the substrate 101, and storage node contact structures 103 and 104 connected to the substrate 101 through the interlayer insulating layer 102. The semiconductor device further includes a capacitor structure formed on the interlayer insulating layer 102. The capacitor structure is connected to the storage node contact structures 103 and 104 and includes a lower electrode 310 including a pillar structure, a dielectric layer 120 covering the entire structure including the lower electrode 310, and the upper electrode structure 130 formed on the dielectric layer 120.

The lower electrode 310 may include metal silicon nitride. For example, the lower electrode 310 may include titanium silicon nitride.

The lower electrode 310 may be formed by an atomic layer deposition process. The lower electrode 310 according to an embodiment of the present invention may include titanium silicon nitride, and thus, an atomic layer deposition process for forming the lower electrode 310 may be performed as a process for forming titanium silicon nitride. The atomic layer deposition process for forming the lower electrode 310 may refer to the timing diagram of FIG. 8.

Referring to FIG. 8, a unit cycle for forming titanium silicon nitride may proceed in the order of a step of supplying a Ti precursor and a Si source, a step of supplying a Si source, a step of supplying a purge gas, a step of supplying a reaction gas, and a step of supplying a purge gas. That is, in the unit cycle for forming the titanium silicon nitride according to an embodiment of the present invention, the steps of supplying a purge gas and the reaction gas may be sequentially performed after the step of supplying the Si source is performed twice.

Figure 7A:
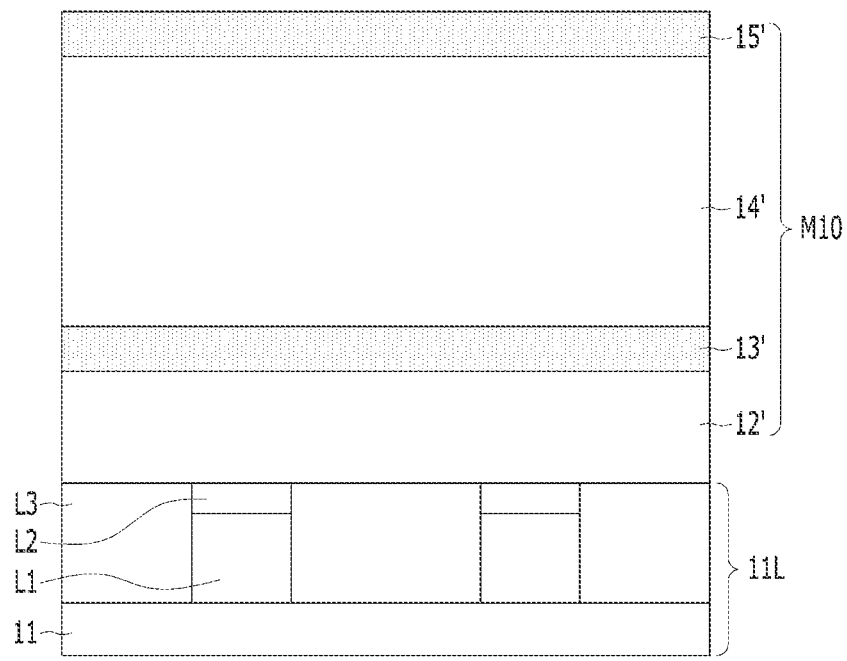
FIGS. 7A to 7H are cross-sectional views illustrating a method of fabricating a semiconductor device according to an embodiment of the present invention.
Figure 7B:
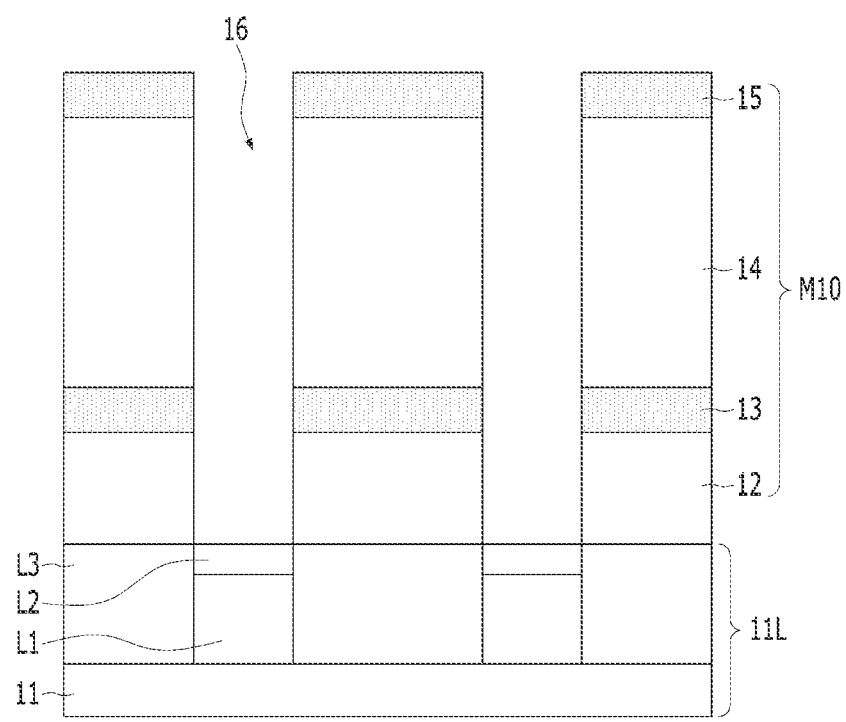

The step of supplying the Ti precursor and the Si source may refer to the step of forming a precursor layer, a silicon layer, and a metal silicon layer by supplying a metal-containing precursor and a Si source gas onto a deposition target layer (in this embodiment, referring to the mold structure M10 including the opening 16 shown in FIG. 7B) in a reaction space. For example, the Ti precursor may include $TiCl_4$, but is not limited thereto. The Ti precursor may include any metal precursor including titanium. The Si source gas may include, for example, $SiH_4$, but is not limited thereto. The Si source may include any source gas including silicon.

The step of supplying the Si source may refer to a step of forming titanium silicon nitride by supplying a Si source gas onto the mold structure including the opening. The Si source gas may include, for example, $SiH_4$, but is not limited thereto. The Si source may include any source gas including silicon. In an embodiment of the present invention, the content of silicon in the film may be controlled through the step of supplying the Si source. That is, by controlling the content of silicon in the film, the grain size and hardness of the film can be adjusted.

The step of supplying a purge gas may refer to a step of supplying a purge gas onto the mold structure including the opening to remove unnecessary by-products in the reaction space. The purge gas may include, for example, nitrogen ($N_2$) gas.

The step of supplying the reaction gas may refer to the step of forming titanium silicon nitride by supplying the reaction gas onto the mold structure including the opening. The reaction gas may include, for example, $NH_3$, but is not limited thereto, and may include any reaction gas including nitride.

As the content of silicon in the film of the lower electrode 310 increases, the grain size decreases, and the hardness of the film increases. In other words, when an external stress is applied, the dislocation moves along the slip plane of the grain, and in the grain boundary where the orientation of the grain changes, the dislocation movement becomes difficult. Therefore, the hardness of the film may increase because there are relatively more grain boundaries as the grain size decreases.

As a result, bending of the lower electrode structure 310 during the dip-out process may be prevented as the hardness of the lower electrode structure 310 increases.

Figure 4:
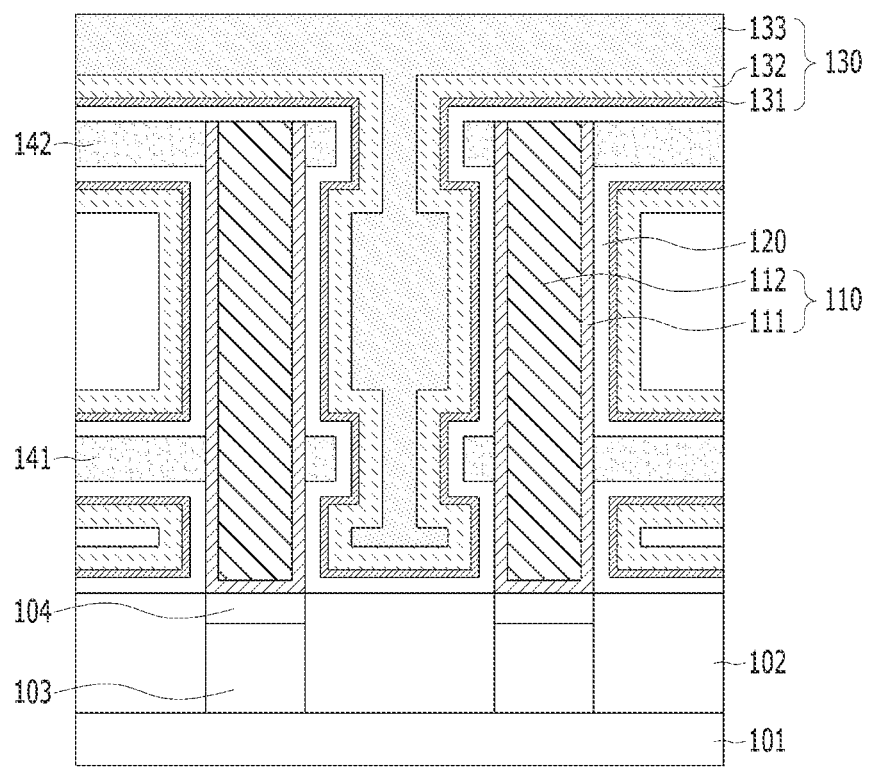

As shown in FIG. 4, the semiconductor device includes a substrate 101, an interlayer insulating layer 102 formed on the substrate 101, and storage node contact structures 103 and 104 connected to the substrate 101 through the interlayer insulating layer 102. The semiconductor device further includes a capacitor structure formed on the interlayer insulating layer 102. The capacitor structure includes a lower electrode structure 110 connected to the storage node contact structures 103 and 104, a dielectric layer 120 covering the entire structure including the lower electrode structure 110, and an upper electrode structure 130 formed on the dielectric layer 120. Supporter layers 141 and 142 having both ends in contact with the sidewall of each lower electrode structure 110 may be disposed between the adjacent lower electrode structures 110, The lower electrode structure 110 may be supported by the supporter layers 141 and 142.

The outer wall of the lower electrode structure 110 may be supported by the first supporter 141 and the second supporter 142. The first supporter 141 and the second supporter 142 may be referred to as a multi-level supporter. In another embodiment, the multi-level supporter may be at least three layers or more. The first supporter 141 and the second supporter 142 may include silicon nitride ($Si_3N_4$) or silicon carbon nitride (SiCN).

The lower electrode structure 110 shown in FIG. 4 includes the same configuration as the lower electrode structure 110 shown in FIG. 1.

Figure 5:
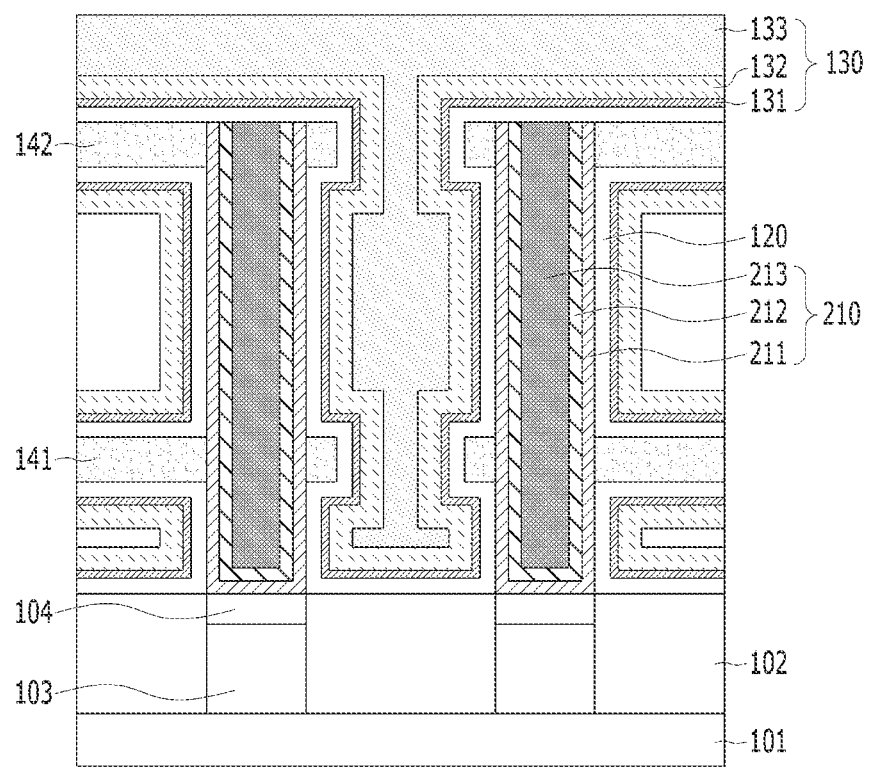

As shown in FIG. 5, the semiconductor device includes a substrate 101, an interlayer insulating layer 102 formed on the substrate 101, and storage node contact structures 103 and 104 connected to the substrate 101 through the interlayer insulating layer 102. The semiconductor device further includes a capacitor structure formed on the interlayer insulating layer 102, The capacitor structure includes a lower electrode structure 210 connected to the storage node contact structures 103 and 104, a dielectric layer 120 covering the entire structure including the lower electrode structure 210, and an upper electrode structure 130 formed on the dielectric layer 120. Supporter layers 141 and 142 having both ends in contact with the sidewall of each lower electrode structure 210 may be disposed between the adjacent lower electrode structures 210. The lower electrode structure 210 may be supported by the supporter layers 141 and 142.

The outer wall of the lower electrode structure 210 may be supported by the first supporter 141 and the second supporter 142. The first supporter 141 and the second supporter 142 may be referred to as a multi-level supporter. In another embodiment, the multi-level supporter may have at least three layers or more. The first supporter 141 and the second supporter 142 may include silicon nitride ($Si_3N_4$) or silicon carbon nitride (SiCN).

The lower electrode structure 210 shown in FIG. 5 has the same configuration as the lower electrode structure 210 shown in FIG. 2.

Figure 6:
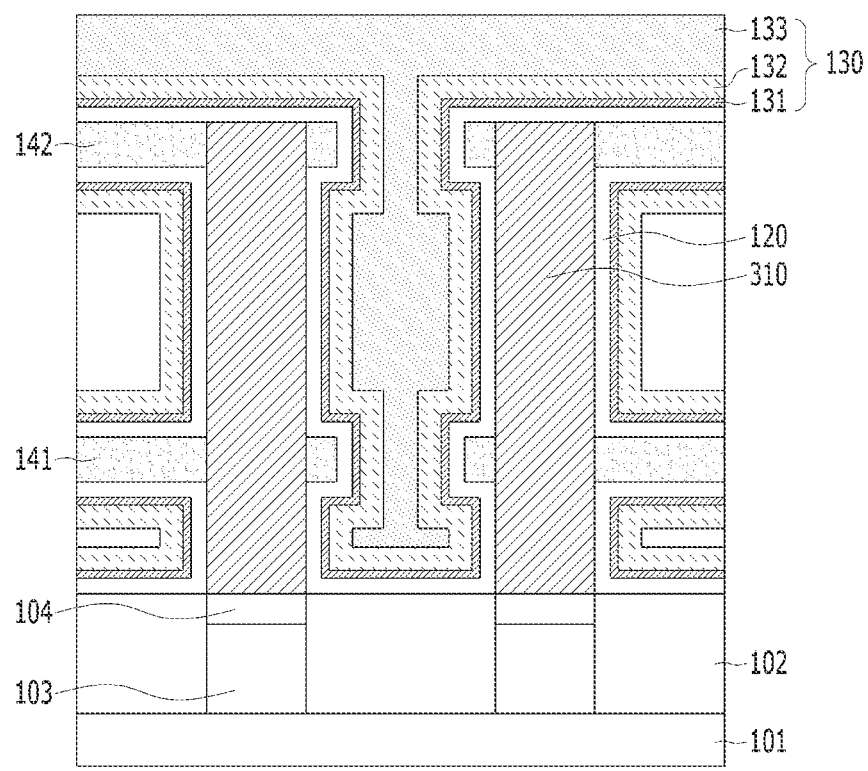

As shown in FIG. 6, the semiconductor device includes a substrate 101, an interlayer insulating layer 102 formed on the substrate 101, storage node contact structures 103 and 104 connected to the substrate 101 through the interlayer insulating layer 102, The semiconductor device further includes a capacitor structure formed on the interlayer insulating layer 102. The capacitor structure is connected to the storage node contact structures 103 and 104 and includes a lower electrode 310 including a pillar structure, a dielectric layer 120 covering the entire structure including the lower electrode 310, and the upper electrode structure 130 formed on the upper portion of the dielectric layer 120. Supporter layers 141 and 142 having both ends in contact with the sideman of each lower electrode 310 may be disposed between the adjacent lower electrodes 310. The lower electrode 310 may be supported by the supporter layers 141 and 142.

The outer wall of the lower electrode 310 may be supported by the first supporter 141 and the second supporter 142. The first supporter 141 and the second supporter 142 may be referred to as a multi-level supporter. In another embodiment, the multi-level supporter may have at least three layers or more. The first supporter 141 and the second supporter 142 may include silicon nitride ($Si_3N_4$) or silicon carbon nitride (SiCN).

The lower electrode 310 shown in FIG. 6 has the same configuration as the lower electrode 310 shown in FIG. 3.

FIGS. 7A to 7H are diagrams illustrating a method of fabricating a semiconductor device according to an embodiment of the present invention, A method of fabricating a semiconductor device including the capacitor structure of FIG. 4 will be described with reference to FIGS. 7A to 7H, The method of fabricating a semiconductor device according to an embodiment of the present invention may be equally applied to the method of fabricating a semiconductor device including the capacitor structures of FIGS. 1 to 6.

As shown in FIG. 7A, a lower structure 11L may be formed. The lower structure 11L may include a semiconductor substrate, semiconductor devices, and interlayer insulating layers. The lower structure 11L may include a region in which memory cells are disposed. The lower structure 11L may include a substrate 11 and a storage node contact plug disposed on the substrate 11. The storage node contact plug may be a stack of a lower plug L1 and an upper plug L2. The storage node contact plug may be connected to the substrate 11 through the interlayer insulating layer L3.

A mold structure M10 may be formed on the lower structure 11L. The mold structure M10 may include a first mold layer 12', a first supporter layer 13', a second mold layer 14', and a second supporter layer 15' which are sequentially stacked on the lower structure 11L. The first mold layer 12' and the second mold layer 14' may be, for example, silicon oxide ($SiO_2$), The first mold layer 12' and the second mold layer 14' may be formed by a deposition process such as chemical vapor deposition (CVD) or physical vapor deposition (PVD). An etch stop layer may be interposed between the lower structure 11L and the mold structure M10. The etch stop layer may serve to protect the lower structure 11L during a subsequent fabrication process such as etching the mold structure M10.

The first and second supporter layers 13' and 15' may be formed of a material having an etch selectivity with respect to the first and second mold layers 12' and 14'. The first supporter layer 13' and the second supporter layer 15' may include silicon nitride or silicon carbon nitride (SiCN), The second supporter layer 15' may be formed to be thicker than the first supporter layer 13'. The first supporter layer 13' and the second supporter layer 15' may be formed to be thinner than the first mold layer 12' and the second mold layer 14'.

As shown in FIG. 7B, a plurality of openings 16 may be formed. The openings 16 may be formed by etching the mold structure M10 using a mask pattern. The opening 16 may be formed by forming a mask pattern on the mold structure M10, and then by an etching process of sequentially etching the second supporter layer 15', the second mold layer 14', the first supporter layer 13', and the first mold layer 12' by using the mask pattern as an etch barrier. The etching process for forming the openings 16 may include dry etching, wet etching, or a combination thereof. The openings 16 may be referred to as a lower electrode (or storage node) hole.

The mold structure M10 etched to form the openings 16 includes a stacked structure of a first mold pattern 12, a first supporter 13, a second mold pattern 14, and a second supporter 15.

The openings 16 may have a high aspect ratio. The openings 16 may have an aspect ratio of at least 1:1 or greater. For example, the openings 16 may have a high aspect ratio of 1:10 or greater. The aspect ratio refers to a ratio of width to height.

Figure 7C:
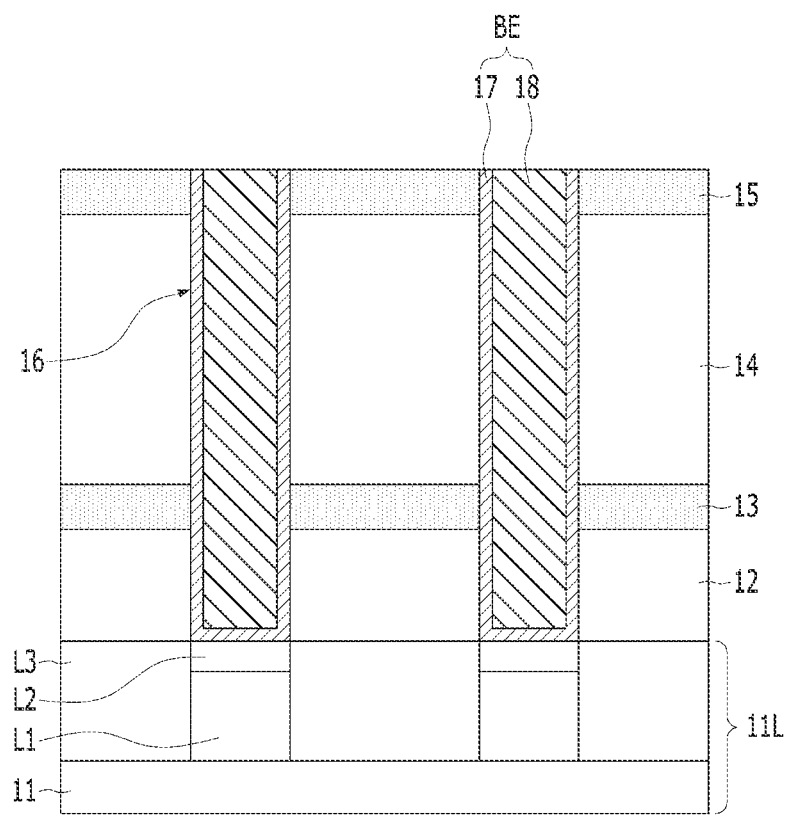

As shown in FIG. 7C, a lower electrode structure BE that gap-fills the opening 16 may be formed.

The lower electrode structure BE may be formed through a series of processes including forming the first lower electrode inside the opening 16, for example, by depositing a first conductive material conformally in the opening 16. Then, a gap-filling process may be performed to gap-fill a second conductive material in the opening 16 for forming the second lower electrode 18 in the opening 16 followed by planarizing the first and second conductive materials with the upper surface of the second supporter 15 as a target to leave the first and second conductive materials in the opening 16 as the first and second lower electrodes 17 and 18. The adjacent lower electrode structures BE may be spaced apart from each other by the mold structure M10. For example, the planarization process may be performed by an etch-back process or a chemical mechanical polishing (CMP) process. In another embodiment, in the planarization process, the CMP process may be performed after the etch-back process is performed, or the etch-back process may be performed after the CMP process is performed.

The upper surface of the lower electrode structure BE may be at the same level as the upper surface of the second supporter 15, that is, the upper surface of the mold structure M10.

The first lower electrode 17 may have a cylinder structure. The first lower electrode 17 may include the same material as the first lower electrode shown in FIGS. 1 and 2. The second lower electrode 18 is provided inside the first lower electrode 17 and may include a pillar structure. The second lower electrode 18 may include the second lower electrode shown in FIG. 1 or a stack structure of the second and third lower electrodes shown in FIG. 2. In another embodiment, the lower electrode structure BE may include a lower electrode including the pillar structure shown in FIG. 3 or FIG. 6.

Figure 7D:
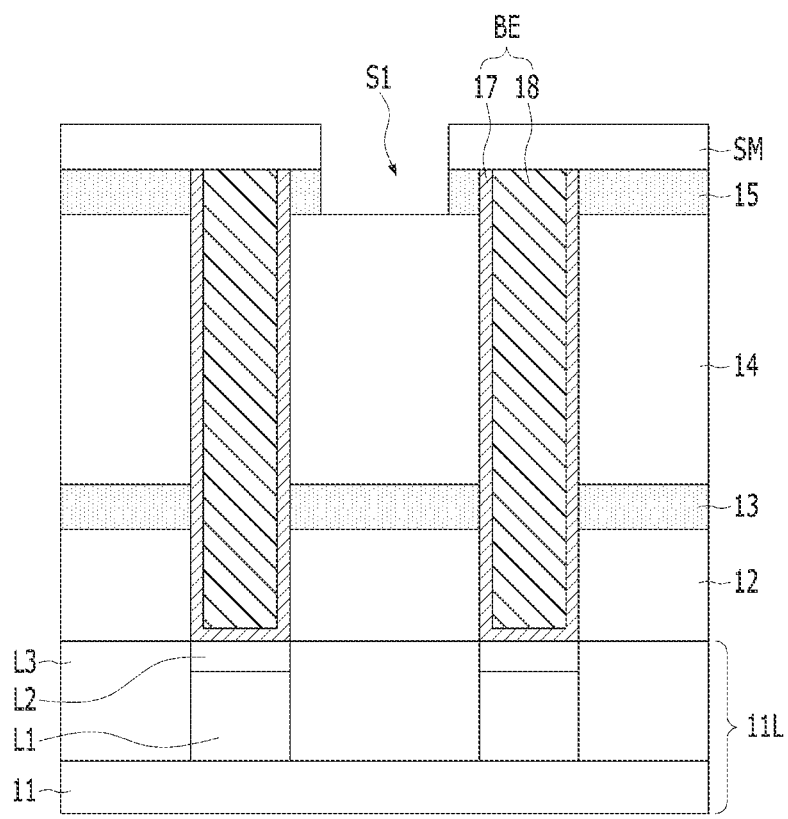

As shown in FIG. 7D, the second supporter 15 may be patterned. In the process of patterning the second supporter 15, a supporter mask pattern SM may be formed on the second supporter 15, and then a part of the second supporter layer 15 exposed by the supporter mask pattern SM may be etched. As the second supporter 15 is patterned, a first supporter opening Si may be formed.

The patterned second supporter 15 may contact the upper sidewall of the lower electrode structure BE. Some surfaces of the second mold pattern 14 may be exposed by the first supporter opening S1. The second supporter 15 may have a shape surrounding a portion of the outer wall of the lower electrode BE. As described above, the second supporter 15 can prevent the lower electrode BE having a large aspect ratio from falling over in a subsequent process of removing the second mold layer 14.

Figure 7E:
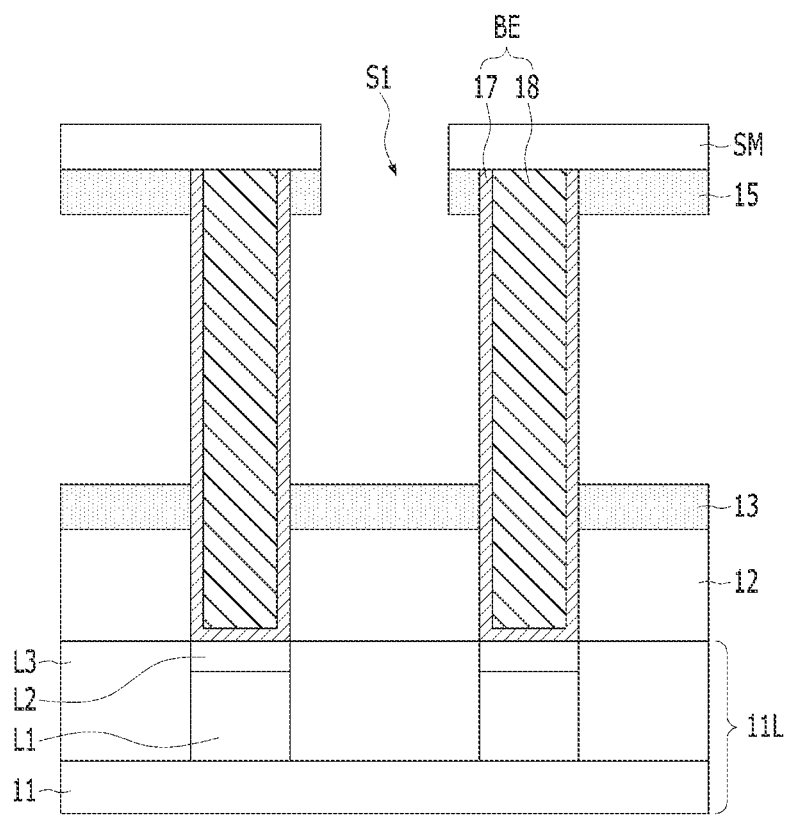

As shown in FIG. 7E, the second mold pattern 14 may be removed. For example, the second mold pattern 14 may be removed by a wet dip-out process. The wet chemical for removing the second mold pattern 14 may be supplied through the first supporter opening S1. For example, the wet chemical may include one or a combination of two or more of wet chemicals consisting of HF, $NH_4F/NH_4OH$, $H_2O_2$, HCl, $HNO_3$, and $H_2SO_4$.

For example, when the second mold pattern 14 is formed of silicon oxide, the second mold pattern 14 may be removed by a wet dip-out process using a chemical containing hydrofluoric add. When the second mold pattern 14 is removed, the second supporter 15 having an etch selectivity with respect to the second mold pattern 14 may remain without being removed. Accordingly, since the adjacent lower electrode structures BE are supported by the second supporter 15, the lower electrode structures BE may be prevented from collapsing.

Figure 7F:
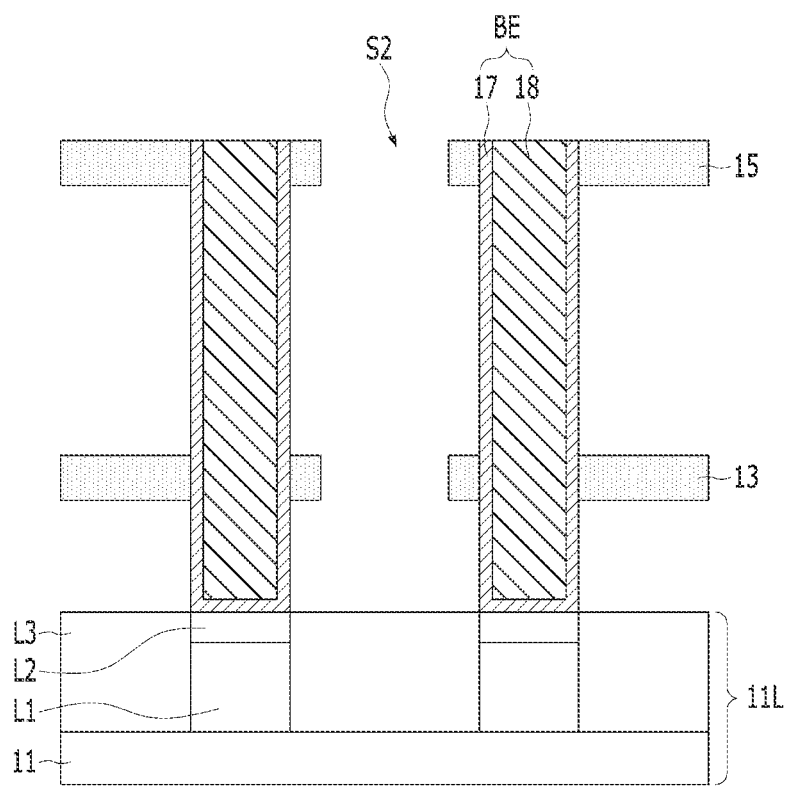

As shown in FIG. 7F, the first supporter 13 may be patterned. The first supporter 13 may be partially etched by using the supporter mask layer SM. As the first supporter 13 is patterned, a second supporter opening S2 may be formed.

The first mold pattern 12 may be removed. For example, the first mold pattern 12 may be removed by a wet dip-out process. The wet chemical for removing the first mold pattern 12 may be supplied through the second supporter opening S2. For example, the wet chemical may include one or a combination of two or more of wet chemicals consisting of HF, $NH_4F/NH_4OH$, $H_2O_2$, HCl, $HNC_3$, and $H_2SO_4$.

For example, when the first mold pattern 12 is formed of silicon oxide, the first mold pattern 12 may be removed by a wet dip-out process. When the first mold pattern 12 is removed, since it is supported by the second supporter 15 and the first supporter 13 having an etch selectivity with respect to the first mold pattern 12, the lower electrode structure BE may be prevented from collapsing.

As the second mold pattern 14 and the first mold pattern 12 are removed, the outer wall of the lower electrode structure BE, except for portions in contact with the first and second supporters 13 and 15, may be exposed. An upper portion of the lower electrode structure BE may be supported by the second supporter 15. The middle portion of the lower electrode structure BE may be supported by the first supporter 13.

Subsequently, the supporter mask pattern SM may be removed.

Figure 7G:
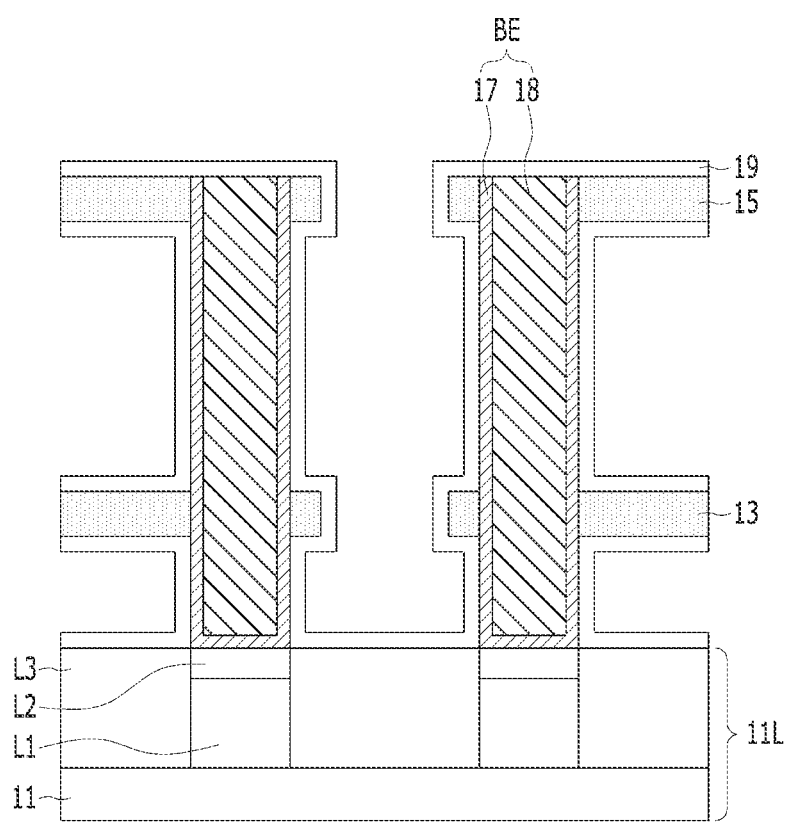

As shown in FIG. 7G, a dielectric layer 19 may be formed. The dielectric layer 19 may be formed on the lower electrode structure BE and on the first and second supporters 13 and 15. A portion of the dielectric layer 19 may cover the lower structure 11L. The dielectric layer 19 may include the same material as the dielectric layer shown in FIGS. 1 to 6.

Figure 7H:
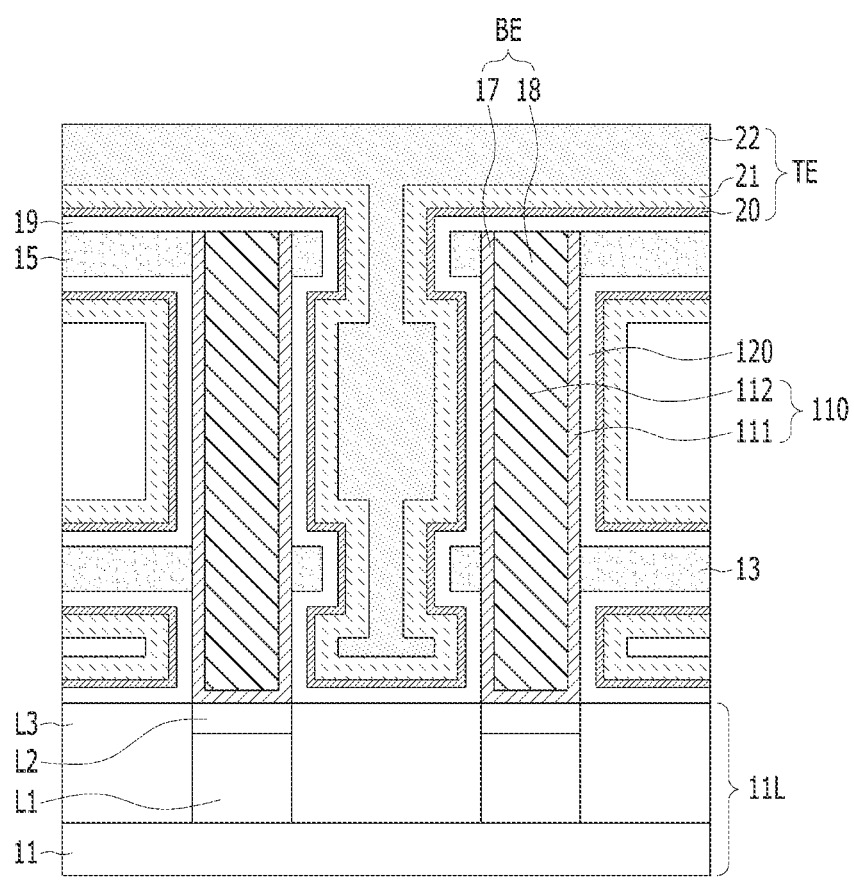

As shown in FIG. 7H, an upper electrode structure TE may be formed on the dielectric layer 19. The upper electrode structure TE may include the same material as the upper electrode structure 130 illustrated in FIGS. 1 to 6, and may be formed through the same process.

The present invention described above is not limited to the above-described embodiments and the accompanying drawings, and it will be apparent to those skilled in the art that various substitutions, modifications, and changes may be made thereto without departing from the spirit and scope of the present invention,

What is claimed is:

1. A semiconductor device comprising:
   a lower electrode structure formed over a substrate, wherein the lower electrode structure has a first lower electrode which is crystalline having a first grain size and a second lower electrode disposed inside the first lower electrode, the second lower electrode is crystalline having a second grain size smaller than the first grain size;
   a dielectric layer formed over the lower electrode structure; and
   an upper electrode structure formed on the dielectric layer and including a silicon-containing amorphous layer in contact with the dielectric layer.

2. The semiconductor device of claim 1, wherein the upper electrode structure includes a stack structure of an amorphous metal silicon nitride layer and a crystalline metal nitride layer.

3. The semiconductor device of claim 2, wherein the crystalline metal nitride layer includes titanium nitride (TiN).

4. The semiconductor device of claim 2, wherein a thickness of the amorphous metal silicon nitride layer is smaller than a thickness of the crystalline metal nitride layer.

5. The semiconductor device of claim 1, wherein the upper electrode structure has a continuity and covers an entire surface of the dielectric layer.

6. The semiconductor device of claim 1, wherein the silicon-containing amorphous layer includes amorphous titanium silicon nitride.

7. The semiconductor device of claim 1, wherein the upper electrode structure includes a stack structure of an amorphous metal silicon nitride layer, a crystalline metal nitride layer, and a semiconductor material layer.

8. The semiconductor device of claim 1, wherein the upper electrode structure includes a stack structure of an amorphous metal silicon nitride layer, a crystalline metal nitride layer, a silicon germanium layer, and a tungsten layer.

9. The semiconductor device of claim 1,
wherein
the first lower electrode has a cylinder structure, and
the second lower electrode has a pillar structure.

10. The semiconductor device of claim 9, wherein a hardness of the second lower electrode is greater than a hardness of the first lower electrode.

11. The semiconductor device of claim 9, wherein the first lower electrode includes a metal nitride, and the second lower electrode includes a metal silicon nitride.

12. The semiconductor device of claim 9, wherein the first lower electrode includes titanium nitride or a low-resistivity metal nitride.

13. The semiconductor device of claim 9, wherein the second lower electrode includes titanium silicon nitride.

14. The semiconductor device of claim 1, further including a supporter supporting an outer wall of the lower electrode structure.

15. A semiconductor device comprising:
a lower electrode structure including a stack structure of a first lower electrode formed over a substrate and having a cylinder structure and a second lower electrode disposed inside the first lower electrode, wherein the lower electrode structure is crystalline having a first grain size and the second lower electrode is crystalline having a second grain size, the second grain size is smaller than the first grain size;
a dielectric layer formed over the lower electrode structure; and
an upper electrode structure formed over the dielectric layer.

16. The semiconductor device of claim 15, wherein the second lower electrode has a pillar structure.

17. The semiconductor device of claim 15, wherein the first lower electrode includes a metal nitride, and the second lower electrode includes a metal silicon nitride.

18. The semiconductor device of claim 15, wherein the first lower electrode includes a titanium nitride or a low-resistivity metal nitride.

19. The semiconductor device of claim 15, wherein the second lower electrode includes a titanium silicon nitride.

20. The semiconductor device of claim 15, wherein the dielectric layer is in direct contact with the first lower electrode.

21. The semiconductor device of claim 15, further including a supporter supporting an outer wall of the lower electrode structure.

22. The semiconductor device of claim 15, wherein the upper electrode structure includes a silicon-containing amorphous layer in direct contact with the dielectric layer.

23. The semiconductor device of claim 22, wherein the silicon-containing amorphous layer includes an amorphous titanium silicon nitride.

24. The semiconductor device of claim 15, wherein the upper electrode structure includes a stack structure of an amorphous metal silicon nitride layer and a crystalline metal nitride layer.

25. The semiconductor device of claim 24, wherein the crystalline metal nitride layer includes a titanium nitride.

26. The semiconductor device of claim 24, wherein a thickness of the amorphous metal silicon nitride layer is smaller than a thickness of the crystalline metal nitride layer.

27. The semiconductor device of claim 15, wherein the upper electrode structure has a continuity and covers an entire surface of the dielectric layer.

28. The semiconductor device of claim 15, wherein the upper electrode structure includes a stack structure of an amorphous metal silicon nitride layer, a crystalline metal nitride layer, and a semiconductor material layer.

29. The semiconductor device of claim 15, wherein the upper electrode structure includes a stack structure of an amorphous metal silicon nitride layer, a crystalline metal nitride layer, a silicon germanium layer, and a tungsten layer.

30. A method of fabricating a semiconductor device, the method comprising:
forming a lower electrode structure over a substrate, wherein the lower electrode structure has a first lower electrode which is crystalline having a first grain size and a second lower electrode disposed inside the first lower electrode, the second lower electrode is crystalline having a second grain size smaller grain than the first grain size;
forming a dielectric layer over the lower electrode structure; and
forming an upper electrode structure including a silicon-containing amorphous layer over the dielectric layer.

31. The method of claim 30, wherein the forming of the upper electrode structure includes:
forming an amorphous metal silicon nitride layer over the dielectric layer; and
forming a metal nitride layer over the amorphous metal silicon nitride layer.

32. The method of claim 31, wherein the forming of the amorphous metal silicon nitride layer and the forming of the metal nitride layer are performed in-situ.

33. The method of claim 31, wherein the forming of the amorphous metal silicon nitride layer and the forming of the metal nitride layer is performed by an atomic layer deposition process.

34. The method of claim 33, wherein the atomic layer deposition process for forming the amorphous metal silicon nitride layer is performed by repeating a unit cycle, the unit cycle including a step of supplying a Ti precursor, a step of supplying a purge gas, a step of supplying a reaction gas, the step of supplying a purge gas, a step of supplying a Si source and a purge gas.

35. The method of claim 33, wherein the atomic layer deposition process of forming the crystalline metal silicon nitride layer is performed by repeating a unit cycle, the unit cycle including a step of supplying a Ti precursor, a step of supplying a purge gas, a step of supplying a reaction gas and a purge gas.

36. The method of claim 31, wherein the amorphous metal silicon nitride layer includes an amorphous titanium silicon nitride, and the metal nitride layer includes a titanium nitride.

37. The method of claim 30,
wherein the forming of the lower electrode structure includes:
forming a mold structure over the substrate;
forming an opening by etching the mold structure;
forming the first lower electrode along an inner surface of the opening, the first lower electrode having a cylinder structure;
forming the second lower electrode gap-filling an inside of the first lower electrode, the second lower electrode having a pillar structure; and
exposing an outer wall of the lower electrode structure by removing the mold structure.

38. The method of claim 37, wherein the first lower electrode includes metal nitride, and the second lower electrode includes metal silicon nitride.

39. A method of fabricating a semiconductor device, the method comprising:
- forming a lower electrode structure including a stack structure of a first lower electrode having a cylinder structure and formed over a substrate and a second lower electrode, the second lower electrode being disposed inside the first lower electrode, wherein the lower electrode structure is crystalline having a first grain size and the second lower electrode is crystalline having a second grain size, the second grain size is smaller than the first grain size;
- forming a dielectric layer over the lower electrode structure; and
- forming an upper electrode structure over the dielectric layer.

40. The method of claim 39,
wherein the forming of the lower electrode structure includes:
- forming the first lower electrode over the substrate, the first lower electrode having a cylinder structure; and
- forming the second lower electrode disposed inside the first lower electrode and having pillar structure.

41. The method of claim 39,
wherein the forming of the upper electrode structure includes:
- forming an amorphous metal silicon nitride layer over the dielectric layer; and
- forming a metal nitride layer over the amorphous metal silicon layer.

42. The method of claim 41, wherein the amorphous metal silicon nitride layer and the metal nitride layer are formed in a same chamber in-situ by an atomic layer deposition process.

43. The method of claim 42,
wherein the atomic layer deposition process for forming the amorphous metal silicon nitride layer is performed by repeating a unit cycle, the unit cycle including a step of supplying a Ti precursor, a step of supplying a purge gas, a step of supplying a reaction gas, a step of supplying a purge gas, a step of supplying a Si source and a purge gas; and
wherein an atomic layer deposition process for forming a crystalline metal silicon nitride layer is performed by repeating a unit cycle, the unit cycle including a step of supplying a Ti precursor, a step of supplying a purge gas, a step of supplying a reaction gas and a purge gas.

* * * * *